(12) United States Patent
Sanchez et al.

(10) Patent No.: US 12,126,334 B2
(45) Date of Patent: Oct. 22, 2024

(54) VERY LOW VOLTAGE I/O CIRCUIT AND METHOD FOR SCREENING DEFECTS

(71) Applicant: NXP USA, Inc., Austin, TX (US)

(72) Inventors: Hector Sanchez, Austin, TX (US); Thomas Henry Luedeke, Oberbergkirchen (DE); Stephen Robert Traynor, Austin, TX (US)

(73) Assignee: NXP USA, Inc., Austin, TX (US)

( * ) Notice: Subject to any disclaimer, the term of this patent is extended or adjusted under 35 U.S.C. 154(b) by 129 days.

(21) Appl. No.: 17/960,078

(22) Filed: Oct. 4, 2022

(65) Prior Publication Data

US 2024/0113710 A1 Apr. 4, 2024

(51) Int. Cl.
*H03K 17/687* (2006.01)
*H03K 19/0185* (2006.01)
*H03K 19/20* (2006.01)

(52) U.S. Cl.
CPC . *H03K 17/6872* (2013.01); *H03K 19/018521* (2013.01); *H03K 19/20* (2013.01)

(58) Field of Classification Search
CPC ....... H03K 17/6872; H03K 19/018521; H03K 19/20; G01R 31/31713; G01R 31/318572
See application file for complete search history.

(56) References Cited

U.S. PATENT DOCUMENTS

| | | |
|---|---|---|
| 5,600,841 A | 2/1997 | Culbert |
| 6,128,757 A | 10/2000 | Yousuf et al. |
| 7,444,575 B2 | 10/2008 | Ong |
| 7,665,049 B2 | 2/2010 | Muranaka |
| 9,285,417 B2 | 3/2016 | Poindexter et al. |
| 10,008,985 B2 | 6/2018 | van den Berg et al. |
| 2016/0085261 A1 | 3/2016 | Sanchez |
| 2019/0288689 A1 | 9/2019 | Jain et al. |
| 2022/0057448 A1* | 2/2022 | Jagannathan .... G01R 31/31715 |
| 2022/0085812 A1* | 3/2022 | Singh ............ H03K 19/018521 |

OTHER PUBLICATIONS

Yan Liu et al., Investigate for Very-Low-Voltage Test Implemented in Probe, 2019 IEEE 21st Electronics Packaging Technology Conference (EPTC), Dec. 4-6, 2019, pp. 716-720, doi: 10.1109/EPTC47984.2019.9026635.

* cited by examiner

*Primary Examiner* — Daniel D Chang (57) ABSTRACT

A GPIO includes a transmitter having an output stage connected to the I/O pad and adapted to supply transmit data to an I/O pad in response to output data generated by a low voltage core logic operating within a functional voltage range for transmit operations; a receiver adapted to supply receive data to the low voltage core logic operating within the functional voltage range in response to input data received at the I/O pad for receive operations; a VLV transmitter adapted to supply VLV transmit data to the output stage of the transmitter and not directly to the I/O pad in response to output test data generated by the low voltage core logic; and a VLV receiver adapted to supply VLV receive data to the low voltage core logic operating within a low core supply voltage range in response to input data received from the output stage of the transmitter.

11 Claims, 8 Drawing Sheets

VERY LOW VOLTAGE I/O CIRCUIT AND METHOD FOR SCREENING DEFECTS

BACKGROUND OF THE INVENTION

Field of the Invention

The present disclosure is directed in general to the field of semiconductor devices. In one aspect, the present disclosure relates to screening circuits, systems, and methods for screening integrated circuit defects in low voltage microelectronic circuits.

Description of the Related Art

In the production process of integrated circuits, devices are tested to estimate the device yields and possible yield-detracting processing problems. Since the fabrication of integrated circuits includes many processing steps and different technologies, the technological sources of electrical failure, such as short circuits within the integrated circuits or open contacts, are investigated using defect screening tests and structures to detect defective devices and to improve the device quality as well as the processing yield. While defect screening circuits and methods have been developed, there are special challenges with implementing defect screening with low voltage integrated circuit devices. For example, the I/O gating elements that are used for defect screening and that interface with the high voltage domain (e.g., 1.8V) may not be able to operate at the low voltage levels required for very low core Vdd levels (e.g., 0.3 V) logic due to the I/O level shifters which render the effective test voltage to be too high for proper defect screening. Standard device sizing/topology changes in the level shifters lead to high area (due to operation close to the threshold voltage Vth at low core Vdd) and high peak currents (at normal Vdd levels).

As seen from the foregoing, existing systems and methods for identifying semiconductor device defects with low voltage I/O circuits are extremely difficult at a practical level by virtue of the challenges with providing an I/O defect screening circuit that can screen out manufacturing defects at very low voltage core supply voltages without requiring large circuit areas or high peak currents. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

A very low voltage (VLV) input/output (I/O) circuit and method are described for screening out manufacturing defects at very low core supply voltages by providing a general-purpose input/output (GPIO) circuit that connects low voltage core logic to a single I/O pad and that may operate in either a functional mode or a low core-Vdd optimized test mode. To support functional operations, the disclosed GPIO circuit includes a normal output transmitter and normal input receiver connected to the single I/O pad, where the normal output transmitter and normal input receiver are optimized to operate within a functional specification voltage range for data transmit and receive operations. And to support low core-Vdd optimized test mode operations, the disclosed GPIO circuit also includes a VLV transmitter and VLV receiver which are connected over a main output stage of the normal output transmitter to communicate with the single I/O pad, where the VLV transmitter and receiver are optimized to operate within a low Core-Vdd voltage range that is close to the threshold voltage Vth of Core FETs. By connecting the VLV transmitter and VLV receiver to the main output stage of the normal output transmitter instead of directly to the single I/O pad, the main output stage provides a protection block to avoid overvoltage violations in the VLV transmitter and receiver so that the GPIO circuit can operate with a minimum functional voltage. With the disclosed GPIO circuit, the normal output transmitter and normal input receiver can be configured to operate independently from the VLV transmitter and receiver, thereby providing a single-integrated functional I/O and VLV I/O and associated method of control that enables transmitting and receiving of data at voltage levels close to the threshold voltage Vth of Core FETs to effectively run internal data patterns for screening out defects. In this way, the GPIO may be configured to function as a VLV I/O with leakage tests which use a shared I/O pad to pinpoint individual logic paths by proper scan pattern enablement through the VLV Tx/Rx use.

Various illustrative embodiments will now be described in detail with reference to the accompanying figures. As described hereinbelow, the disclosed embodiments can be arranged and designed in a wide variety of different configurations. Thus, the following detailed description of various embodiments, as represented in the figures, is not intended to limit the scope of the present disclosure, but is merely representative of various embodiments. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. In addition, the various aspects of the embodiments are presented in drawings that are not necessarily drawn to scale unless specifically indicated. Furthermore, the described features, advantages, and characteristics of the invention may be combined in any suitable manner in one or more embodiments. One skilled in the relevant art will recognize, in light of the description herein, that the embodiments can be practiced without one or more of the specific features or advantages of a particular embodiment. In other instances, additional features and advantages may be recognized in certain embodiments that may not be present in all embodiments. For example, selected aspects are depicted with reference to simplified circuit schematic drawings without including every circuit detail in order to avoid limiting or obscuring the present invention. Such details are well known and not considered necessary to teach one skilled in the art of how to make or use the present invention.

Figure 1:
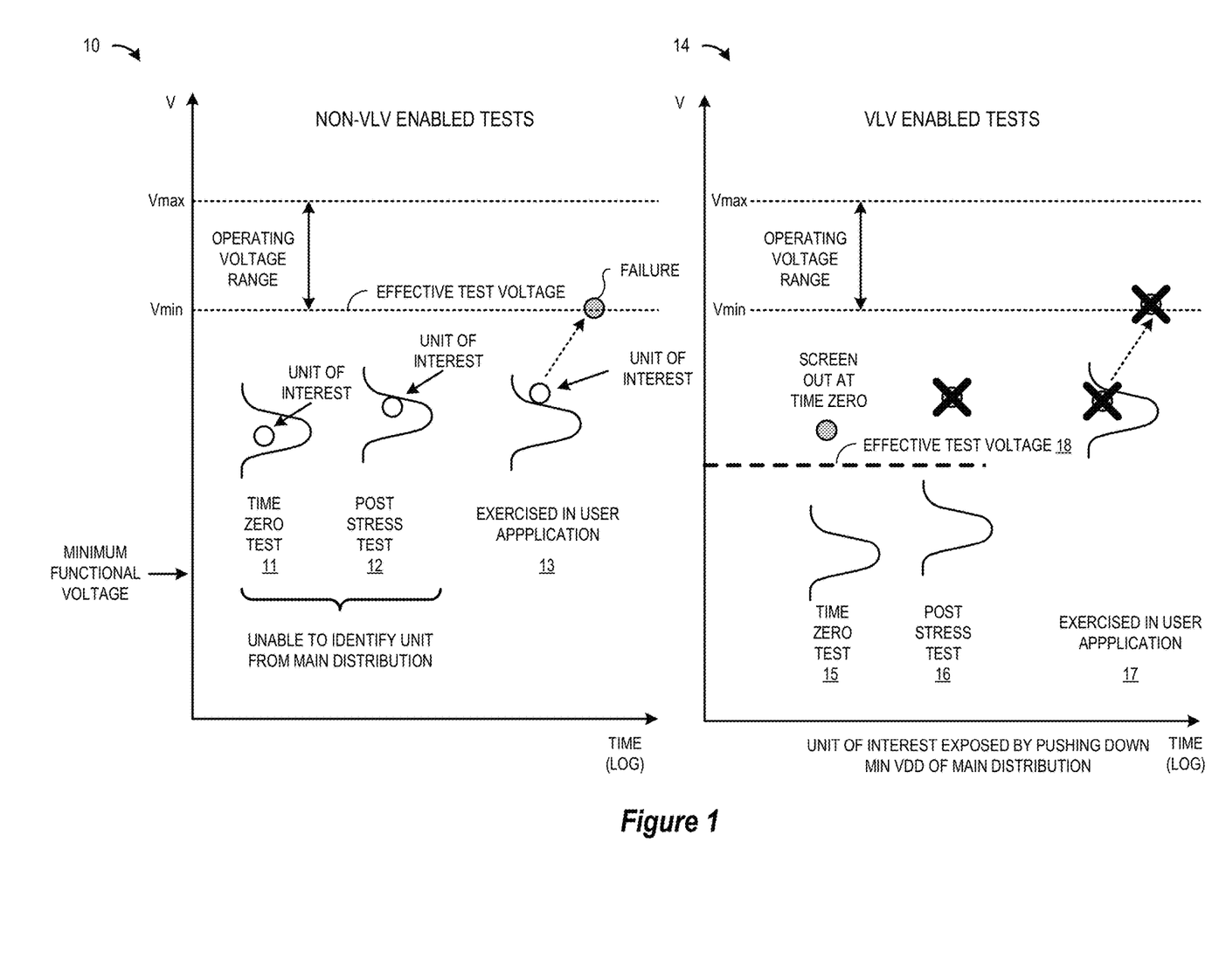
FIG. 1 is a diagrammatic depiction of the effectiveness of performing defect screening over the lifetime of an integrated circuit device for both non-VLV enabled screening tests and VLV enabled screening tests in accordance with selected embodiments of the present disclosure.

To provide additional details for an improved contextual understanding of the present disclosure, reference is now made to FIG. 1 which diagrammatic depicts the effectiveness of performing defect screening over the lifetime of an integrated circuit device for both non-VLV enabled screening tests 10 in accordance with conventional solutions and 14 VLV enabled screening tests in accordance with selected embodiments of the present disclosure. As known to those skilled in the art, existing solutions for detecting defects in integrated circuits use low voltage tests to detect the defects (flaws) that cause early-life failures or intermittent failures by performing a screening test at a supply voltage that is much lower than its nominal operating voltage. Such low voltage tests can detect integrated circuit flaws or defects that do not cause functional failures at some or all normal operating conditions, but that degrade the integrated circuit performance, reduce noise margins, or draw excessive supply current. Examples of such defects include partially missing gate stacks, resistive shorts, and delay flaws that are caused by degraded signals or diminished-drive gates. In the depicted screening tests 10, 14, the functional operating voltage range for the devices being screened ranges from Vmin to Vmax, but the defect screening tests are applied to screen out defects at the lowest possible voltages. With conventional defect screening solutions that do not use VLV-enabled tests, the test diagram 10 shows that most of the devices can operate below the functional operating voltage range, as shown with the distribution of pass-fail voltages at the distribution curves, but as time proceeds, there can be a latent defect in a unit of interest that is not initially detectable, but that eventually results in a device failure. For example, at the "time zero" test distribution 11, there is a distribution of Vmin which has a good low voltage margin to the operating voltage range specification window, but which includes an outlier device (Unit of Interest) with a latent defect that is within the main distribution and not detectable. As time proceeds and one or more post stress tests (e.g., high voltage stress tests, burn-in stress tests, etc.) are applied, the distribution shifts slightly due to stressing, as shown with the post stress test distribution 12 where the unit of interest moves more quickly but is still within the main distribution and therefore not detectable from the main distribution. Since the latent defect in the unit of interest is not detected, it may be shipped to a customer where the unit of interest is exercised in a user application. As depicted with the "exercised in user application" test distribution 13, the unit of interest continues to shift over time as it is used in the application, resulting in a functional failure within the functional operating voltage range and customer quality complaint (CQC).

One of the challenges with conventional low voltage tests is that there are limiters within the test circuits which block the visibility of the true distribution capability of the parts by preventing the true minimum functional voltage from being used in the defect screening tests. An example of such a test circuit limiter is that the level shifters in the I/O circuits tend to limit the low voltage functional range of the I/O circuit. If the limiters can be removed through a design change of the I/O circuit, the main distribution can be lowered to screen the distribution to its natural, true, intrinsic minimum distribution, thereby enabling exposure of defective units in screening tests. This is illustrated with the VLV-enabled test diagram 14 which shows that main distribution is pushed down to the true lowest or minimum operating voltage so that a defective unit can be screened out from the "time zero" test distribution 15. As a result, there is no need to apply post stress tests to this particular unit of interest 16 since the defective unit of interest has already been screened (as indicated by the X). And by removing the defective unit of interest, the "exercised in user application" test distribution 13 shows that there will be no latent unit that is shipped to a customer where it would continue shifting during the customer application and fail early in its lifetime (as indicated by the X's).

Figure 2:
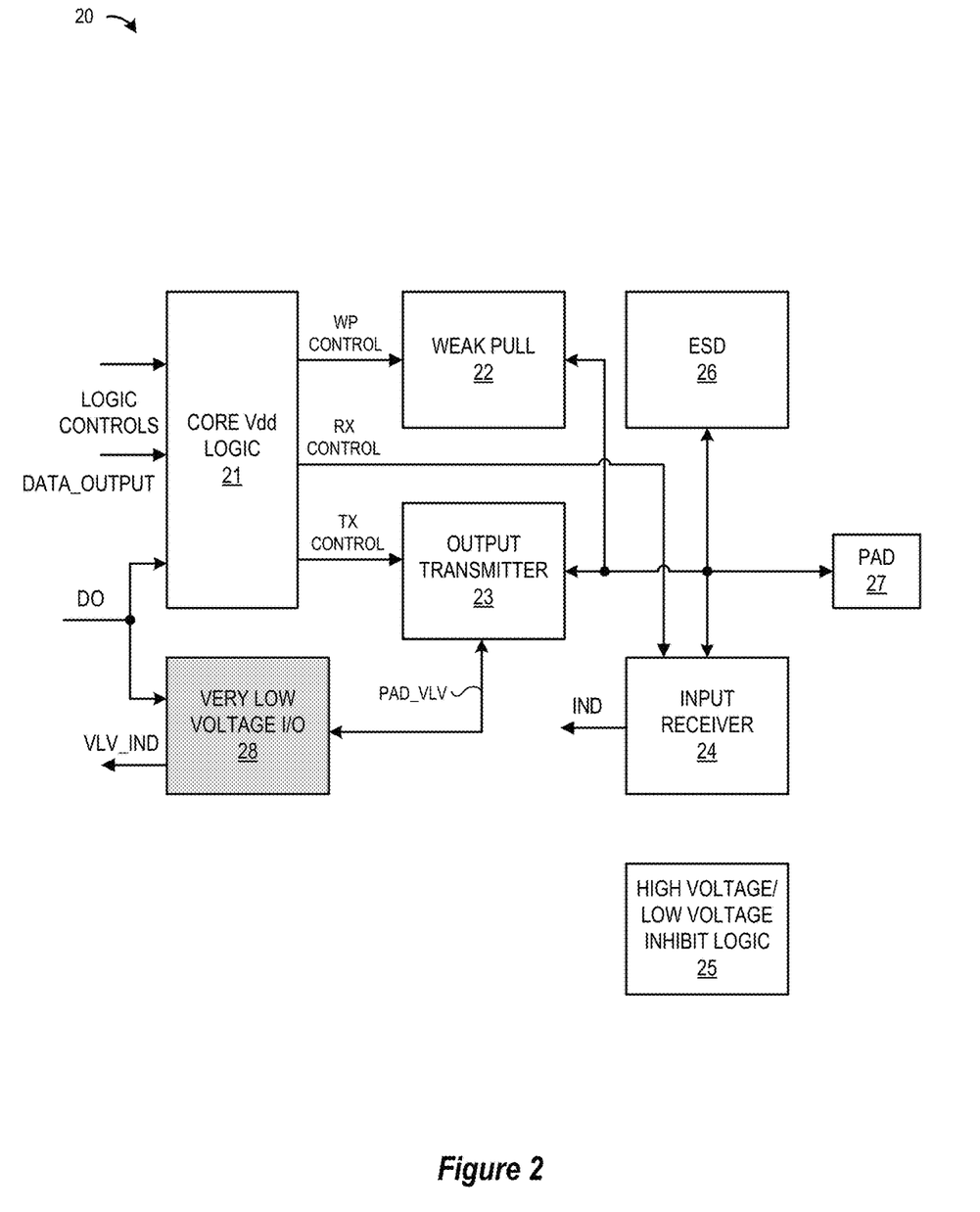
FIG. 2 depicts a simplified block diagram of an input/output (I/O) unit with an integrated VLV I/O circuit in accordance with selected embodiments of the present disclosure.

To address the deficiencies with conventional defect screening approaches and others known to those skilled in the art, there is disclosed herein a method, apparatus, and architecture for an I/O circuit with a built-in VLV circuit that is optimized for two different modes of operation, including a functional I/O mode and a very low voltage I/O mode. Referring now to FIG. 2, there is depicted a simplified block diagram 20 of a general-purpose input/output (GPIO) circuit with an integrated VLV I/O circuit in accordance with selected embodiments of the present disclosure.

As disclosed, the GPIO 20 includes a core Vdd logic block 21 which connects logic control signals and data from the System-on-Chip (SoC) to an input/output pad 27 using the weak pull up/down block 22, output transmitter block 23, input receiver block 24, high voltage/low voltage inhibit logic block 25, electrostatic discharge (ESD) protection block 26, VLV I/O block 28. Generally speaking, the GPIO 20, in "normal" operation, translates the low voltage SoC logic control signals (e.g., 0.8V for SoC) to the external signal levels at the input/output pad 27 (e.g., 1.8V-5V). To this end, the core Vdd logic block 21 decodes the logic control signals into control signals for the weak pull up/down block 22, output transmitter block 23, and input receiver block 24. For example, the control signals (WP Control, RX Control, TX Control) may specify if data is being transmitted or received, or if the GPIO 20 is to be tri-stated, or may enable/disable the weak pull block 22, or may the specify the slew rate of the output stages 23, or may enable/disable the receivers 24, etc. In response to the WP Control signal, the weak pull up/down block 22 may be configured to effectively pull the I/O pad 27 toward the high level or the low level. In addition, the TX Control signal may be applied to the output transmitter 23 to send or transmit data at a specified speed with a specified impedance driver (e.g., 50 52), where the output transmitter 23 typically includes level shifter circuits which shift the low voltage core-side data to higher voltage signal levels for the I/O pad 27. In addition, the RX Control signal may be applied to the input receiver 24 which operates independently from the output transmitter 23 to convert higher voltage input data signals from the I/O pad 27 into the lower voltage input data signals IND for processing by the core Vdd logic block 21.

To protect the I/O pad 27, the GPIO 20 may also include ESD protection block 26 which may be implemented with ESD protection diodes connecting the I/O pad 27 to a supply voltage and ground. In addition, the GPIO 20 may include a high voltage/low voltage inhibit logic 25 wherein one or more buffers which provide control functions for protecting the GPIO 20 during power up and power down conditions by ensuring that the GPIO is in a predictable condition. For example, the I/O pad may be placed in a tri-state condition and the input receiver 24 may force its output IND to 0V.

With the sub-blocks 21-27, the GPIO 20 is configured to operate in a functional I/O mode. However, the GPIO 20 also includes the VLV I/O block 28 which enables the GPIO 20 to operate with very low voltage Core Vdd levels which are needed to enable the detection of defects in logic paths and memories. To this end, the VLV I/O block 28 includes a VLV transmitter (for transmitting the DO signal to the VLV pad PAD_VLV) and VLV receiver (for generating a receive VLV_IND signal) which are connected and configured for operating at close to Vth of Core FETs by being connected over a VLV pad PAD_VLV to an output stage of the output transmitter 23 which provides a protection block to avoid overvoltage violations in the VLV pad PAD_VLV.

Figure 3:
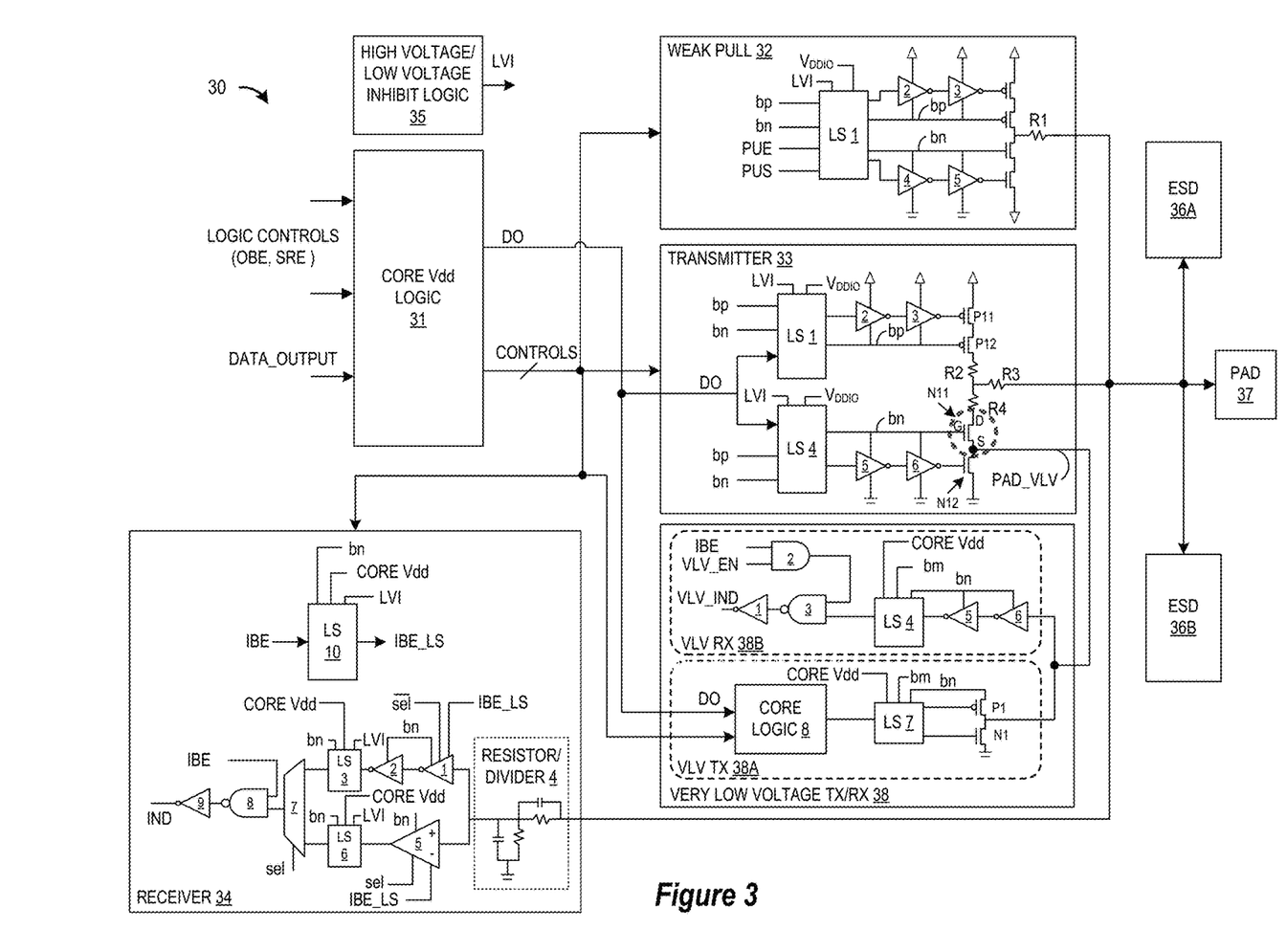
FIG. 3 depicts a simplified circuit schematic of an I/O unit with an integrated VLV I/O circuit in accordance with selected embodiments of the present disclosure.

For an improved understanding of selected embodiments of the present disclosure, reference is now made to FIG. 3 which depicts a simplified circuit schematic of a GPIO unit 30 with an integrated VLV I/O circuit 38 which includes a VLV transmitter 38A and VLV receiver 38B which are connected over a main output stage of the normal output transmitter 33 to communicate with the single I/O pad 37. As disclosed, the GPIO unit 30 includes a core Vdd logic block 31 which connects logic control signals and output data (DO) from the SoC for transmission over the I/O pad 37 using the weak pull up/down block 32, output transmitter block 33, input receiver block 34, high voltage/low voltage inhibit logic block 35, ESD protection diodes 36A, 36B, and VLV Tx/Tx block 38.

Generally speaking, the GPIO 30 provides an interface between the low voltage SoC logic control signals (e.g., 0.8V for SoC) and the external signal levels at the input/output pad 39 (e.g., 1.8V-5V) during normal operation. To this end, the core Vdd logic block 31 decodes the logic control signals into control signals for the weak pull up/down block 32, output transmitter block 33, and input receiver block 34. In addition, the core Vdd logic block 31 decodes the data output signal (DATA OUTPUT) received from the SoC system to generate the data output (DO) signal for delivery to both the transmitter block 33 and the VLV Tx/Rx block 34. To protect the I/O pad 37, the ESD protection diodes 36A, 36B connect the I/O pad 37 to a supply voltage and ground. In addition, the high voltage/low voltage inhibit logic 35 is included to provide independent control functions for protecting the GPIO 30 during power up and power down conditions by generating a low voltage inhibit (LVI) signal to enable the level shifters in the weak pull up/down block 32, output transmitter block 33, and input receiver block 34.

In an example embodiment where the GPIO 30 provides an interface between the core Vdd voltage of 0.8V for the SoC and an external voltage at the I/O pad 37 of 1.8V, the output transmitter block 33 is split into a lower N-side 1.2V-dvss driver and an upper P-side 1.8V-0.6V driver which are connected, respectively, to a lower NFET output stage and an upper PFET output stage. Each depicted output stage includes a 2-stage FET and resistor connected in series to control the output impedance and slew rate. In particular, the upper PFET output stage includes PFET transistors P11, P12 connected in series with the resistor R2, and is connected between the supply voltage (e.g., 1.8V) and the lower NFET output stage. In addition, the lower NFET output stage includes NFET transistors N11, N12 connected in series with the resistor R4, and is connected between the upper PFET output stage and ground. As output data (do) is input to the output transmitter block 33, it is provided to both the upper and lower level shifter (LS) blocks which are controlled by control signal inputs (e.g., output buffer enable (OBE), slew rate enable (SRE)) (not shown) and the low voltage inhibit (LVI) signal. Generated by the upper level shifter 33-1 and lower level shifter 33-4, the p-bias (bp) and n-bias (bn) regulation voltages ensure that the transistors used to form the inverter elements 33-2, 33-3, 33-5, 33-6 operate within their specifications. For example, the transistors used to form the inverter elements 33-2, 33-3 may only be able to handle 1.6V, so the bp signal (e.g., bp=⅓ of the supply voltage Vdde=0.6V) ensures that the transistors used to form the inverter elements 33-2, 33-3 see only 1.8V-0.6V=1.2V. In similar fashion, the bn signal (e.g., bn=⅔ of the supply voltage Vdde=1.2V) provided to the inverter elements 33-5, 33-6 ensures that the transistors used to form the inverter elements 33-5, 33-6 see only 1.2V. As shown, the output transmitter block 33 includes a cascoded output stage formed from the series connection of PFETs P11, P12 and NFETs N11, N12 which are connected and gate-biased as shown to operate within the voltage limits of the application. As depicted, the cascoded output stage includes resistors R2-R4 which are connected as shown to linearize the output impedance of the output transmitter block 33 to be close to a predetermined output impedance (e.g., 50 52).

In similar fashion, the weak pull up/down block 32 includes a level shifter 32-1 that is connected to receive three supplies ($V_{DDIO}$, bn, bp) and control signals (pull up enable (PUE), pull up select (PUS)), and that is connected to drive either an upper side P-side driver 32-2, 32-3 or a lower N-side driver 32-4, 32-5 which are connected, respectively, over a cascoded upper PFET output stage and an lower NFET output stage which are connected at a shared node to a high impedance output resistor R1 which pulls the I/O pad voltage up or down.

The depicted input receiver block 34 is powered by a separate 1.2V-dvss section and contains two receivers, including a high performance, high precision Vref-based receiver 34-5 and a medium performance, low power CMOS inverter receiver 34-1, 34-2. Similar to the situation with the output transmitter block 33, the input receiver block 34 has constraints in terms of the being constructed with transistors in the inverter elements 34-1, 34-2 that are only able to handle intermediate voltages (e.g., 1.6V). While the input receiver block 34 could share the generated internal bias rail signal bn, bp with the output transmitter section 33, this could result in Tx-data-dependent jitter on the Rx output.

Accordingly, the input receiver block 34 instead uses a resistor-divider circuit 34-4 to attenuate the input signal to the correct input signal level. The values of the depicted resistors and capacitors in the resistor-divider circuit 34-4 are controlled so that a 1.8V input signal will be attenuated to the correct signal level to match the internal supply at the internal receivers. The attenuated input signal is provided as an input to both the high performance, high precision Vref-based receiver 34-5 and the medium performance, low power CMOS inverter receiver 34-1, 34-2, both of which are gated by an input buffer enable signal level shift signal (IBE_LS) that is generated by a normal level shifter 34-10 which level shifts from core Vdd voltage to the n-bias (bn) under control of the LVI. The Vref-based receiver 34-5 and CMOS inverter receiver 34-1 are also respectively gated by the select bar and select signals. The level shifters 34-3, 34-6 provide a down level shift function to convert the 1.2V input signals to 0.8V output signals that are supplied to the multiplex selector 34-7 which connects the selected output to the NAND gate 34-8 where it is logically combined with the input control signal IBE.

Generally speaking, the I/O sub-blocks 31-35 in the GPIO 30 are configured to operate in a functional I/O mode. However, in the output transmitter block 33 and input receiver block 34, the level shifters tend the limit the low voltage functional range of the GPIO 30. Due to the nature of the sizing scheme and necessary stacked configurations, the consideration for normal operation voltage constraints means that these level shifters are safe-stated at low Core Vdd levels to avoid incorrect logical operation. To properly test memories and SoC logic, the GPIO 30 must have the ability to operate at the low Core Vdd levels to expose timing paths affected by defects. Accordingly, the GPIO 30 also includes the VLV Tx/Rx block 38 that is integrated to work in parallel with the normal GPIO. In selected embodiments, the integrated VLV Tx/Rx block 38 has a reasonably low area overhead. In addition, the VLV Tx/Rx block 38 can be active at any time, though a targeted low voltage range spans down to ~0.35V-0.4V—a level chosen based on the threshold voltages of the core devices. In this way, the VLV Tx/Rx block 38 enables the GPIO 30 to operate with very low voltage Core Vdd levels which are needed to enable the detection of defects in logic paths and memories.

In selected embodiments, the VLV I/O block 38 includes a VLV transmitter 38A and VLV receiver 38B which are provided to mimic the transmit and receive functionality that is present in the output transmitter block 33 and input receiver block 34, but are configured and connected to operate at the natural, true, intrinsic minimum functional voltage that is close to Vth of Core FETs. To this end, the VLV transmitter 38A and VLV receiver 38B are not directly connected to the I/O pad 37, but are instead connected to a VLV pad node (PAD_VLV) at the output stage of the transmitter 33.

With this connection of the VLV pad node to the source node of the NFET N11, the received input signal is sampled by the VLV RX block 38B at the low voltage source side of the NFET N11, and not at the high voltage drain side of the NFET N11. After processing by the receiver inverters 38-5, 38-6, the received input signal is level shifted by the level shifter 38-4 from the intermediate voltage (e.g., 1.2V) to the core Vdd voltage level (e.g., 0.6V) without being limited by any level shifter constraints on the front end. To this end, the level shifter 38-4 includes an intermediate m-bias (bm) between the "bn" and Core Vdd levels which is targeted at bm=VDDIO/2~0.9V to aid in the VLV level shifting operation such that Core oxide transistors can be driven from 1.2V levels directly through pass gates and not cause high voltage exposure of the Core transistors. In this way, the intermediate m-bias (bm) facilitates the signal transmission between "bn" level and "Core Vdd" level since there are "Core oxide" FETs that would otherwise see "bn" levels if "bm" was not additionally used to limit the internal voltages seen by "Core oxide" FETs to approximately bm-Vth, which puts it in the range of voltage limit of the Core Oxide FETs. As a result, the VLV I/O block 38 does not require an attenuator to operate, but instead uses the stacked NFET transistors N11, N12 from the output transmitter block 33 which provide protection to block higher voltage I/O pad levels (e.g., 1.8V) from violating the internal transistors of the VLV RX block 38B. With this connection to the VLV pad node, the VLV receiver 38B provides a low-voltage/low current receiver that is powered from the bias signal bn of the output transmitter block 33 only in very low voltage test modes.

And with the VLV TX block 38A also connected over the VLV pad node to the source node of the NFET N11, the core logic 38-8 is operating at the core Vdd voltage level (e.g., 0.4V) which is shifted by the level shifter 38-7 to the intermediate voltage level (e.g., 1.2V) before being supplied to the driver transistor stack P1, N1. As will be appreciated, the layout area of the VLV I/O block 38 is quite small (e.g., 3-4%) compared to the remainder of the GPIO 30. In addition, the strength of the driver transistor stack P1, N1 is much smaller than the output stage driver of the transmitter block 33. As a result, the output signal generated at the I/O pad 37 will be quite small. While speed of the I/O pad 37 can be reduced (e.g., from 200 MHz to 20 MHz) to compensate for the smaller driver performance of the VLV TX block 38A, the connection of the driver transistor stack P1, N1 to the VLV pad node means that output signal at the I/O pad will be 1V or less (e.g., 400-800 mV), but these levels can still be used with test screening methods which can have the threshold adjusted to detect the signals.

As seen from the foregoing, the VLV I/O circuit 38 is designed to operate at the low Core Vdd levels that simply cannot be achieved with the "regular" transmitter block 33 and receiver block 34 which are formed with normal level shifters which use thick oxide transistors driven by Core Vdd level as part of the level shifter. In contrast, the VLV transmitter 38A and VLV receiver 38B may be constructed with "core oxide" transistors that can operate at low Core Vdd levels. As will be appreciated by those skilled in the art, it is prohibitively complex and expensive to include "core oxide" transistors in the normal level shifters that would be required for the "regular" transmitter block 33 and receiver block 34 to meet the performance and reliability requirements for very low voltage defect screening. For example, the control signals IBE, OBE provided to a normal level shifter may not correctly resolve or evaluate to the correct logic state at low voltage, which is why the LVI signal is needed to ensure that a potentially "incorrect" logic state is propagates to either the transmitter block 33 and/or receiver block 34 outputs. On this point, note that the IBE signal does not go to a level shifter 38-4 or to the input receiver 38-6 of the VLV RX 38B (as opposed to the receiver elements 34-1, 34-5 which receive the IBE_LS signal) precisely to avoid level shifting of the control signal and the potential for incorrect logic state.

Figure 4:
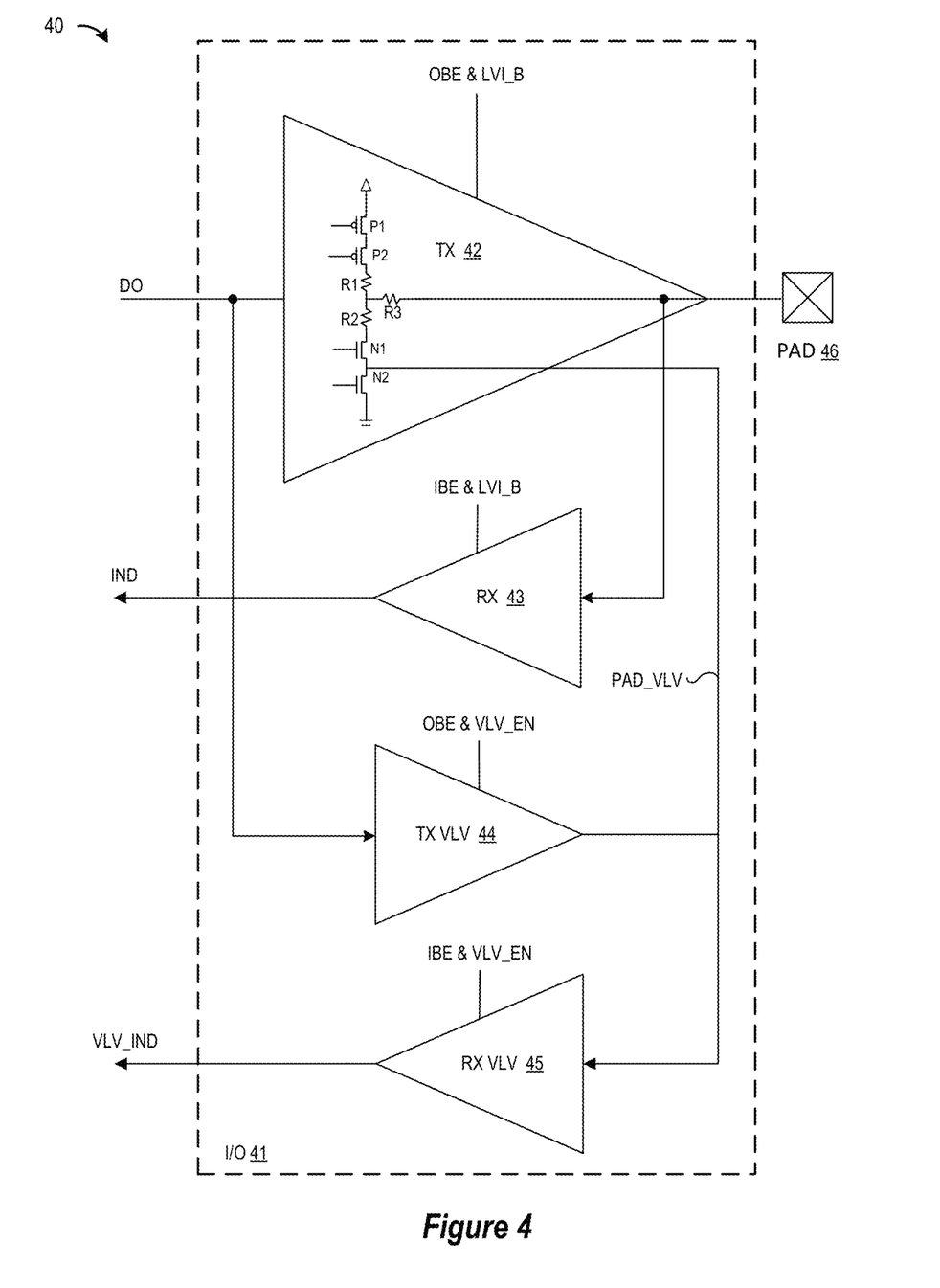
FIG. 4 depicts a simplified logic view of an I/O unit with operational mode transmitter and receiver circuits and with an VLV mode transmitter and receiver circuits connected through a transmit output stage of the operational mode transmitter to a shared pad in accordance with selected embodiments of the present disclosure.

For an improved understanding of selected embodiments of the present disclosure, reference is now made to FIG. 4 which depicts a simplified logic view 40 of an I/O unit 41 with operational mode transmitter 42 and receiver 43 connected to an I/O pad 46, and with an VLV transmitter 44 and VLV receiver 45 circuits connected through a transmit output stage of the operational mode transmitter 42 to the shared I/O pad 46. As depicted, the operational mode transmitter 42 is connected to receive output data DO from the core logic at very low core Vdd levels (e.g., 0.3 V) and to drive the I/O pad 46 at the high voltage levels (e.g., 1.8V) using the cascoded output stage P1, P2, N1, N2, R1-R3 wherein the drain of the NFET N1 is connected over the resistor R3 to the I/O pad 46. To activate or enable the operational mode transmitter 42, both the output buffer enable signal (OBE) and the low voltage inhibit bar signal (LVI_B) must be set (e.g., OBE=LVI_B=Logic 1) and received as gating control signals by the operational mode transmitter 42. In similar fashion, the operational mode receiver 43 is connected to receive input data from the I/O pad 46 at a high voltage level (e.g., 1.8V) and to generate the input data IND that is supplied to the core logic at a very low core Vdd level (e.g., 0.3 V) when activated or enabled by both the input buffer enable signal (IBE) and the low voltage inhibit bar signal (LVI_B) being set (e.g., IBE=LVI_B=Logic 1) and received as gating control signals by the operational mode receiver 43. In this configuration, the operational mode transmitter 42 and receiver 43 are enabled by the gating control signal during normal device operation, but can be disabled during the VLV testing mode as described hereinbelow.

To properly test integrated circuit and SoC logic for defects with very low voltage tests which configure the I/O 41 to operate at the minimum functional voltage, the I/O unit 41 also includes a VLV transmitter 44 and a VLV receiver 45 which are disabled during normal I/O operations. In particular, the VLV transmitter 44 is connected to receive output data DO from the core logic at very low core Vdd levels (e.g., 0.3 V) and to drive an internal VLV pad PAD_VLV at an intermediate voltage level (e.g., 1.2V). Instead of being connected directly to the I/O pad 46, the internal VLV pad PAD_VLV is connected to the source of the NFET N1 in the cascoded output stage P1, P2, N1, N2, R1-R3 of the operational mode transmitter 42. To activate or enable the VLV transmitter 44, both the output buffer enable signal (OBE) and the VLV test enable signal (VLV_EN) must be set (e.g., OBE=VLV_EN=Logic 1) and received as gating control signals by the VLV transmitter 44. In similar fashion, the VLV receiver 45 is connected to receive input data from the internal VLV pad PAD_VLV at an intermediate voltage level (e.g., 1.2V) and to generate the VLV input test data VLV_IND that is supplied at a very low core Vdd level (e.g., 0.3 V) when activated or enabled by both the input buffer enable signal (IBE) and the VLV test enable signal (VLV_EN) being set (e.g., IBE=VLV_EN=Logic 1) and received as gating control signals by the VLV receiver 45.

Figure 5:
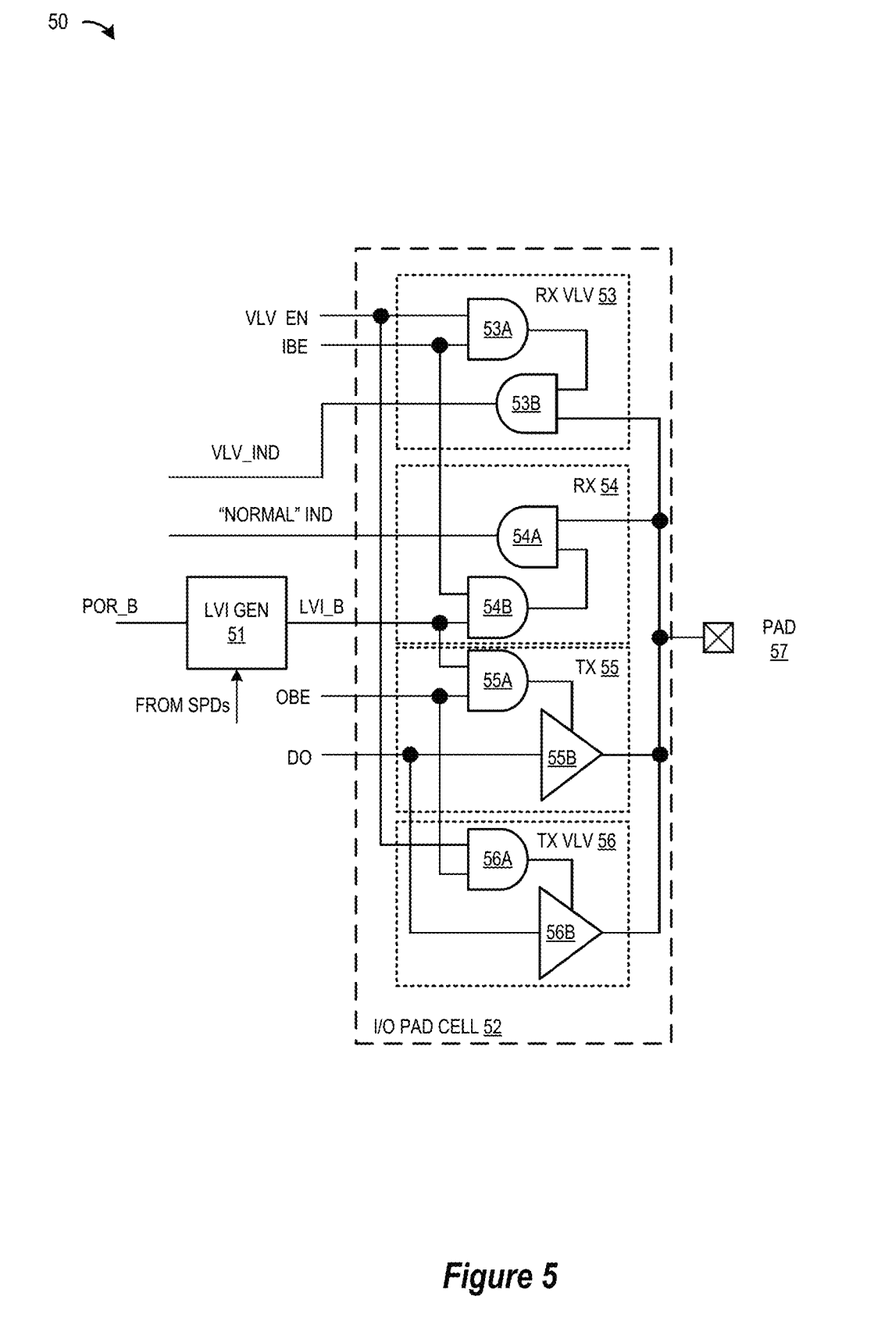
FIG. 5 depicts a logic gate implementation of an I/O unit with operational mode transmitter and receiver circuits and with an VLV mode transmitter and receiver circuits connected through a transmit output stage of the operational mode transmitter to a shared pad in accordance with selected embodiments of the present disclosure.

For an improved understanding of selected embodiments of the present disclosure, reference is now made to FIG. 5 which depicts a logic gate implementation 50 of an I/O pad cell 52 which may be configured to operate in either a normal operational mode or a VLV test screening mode based on gating control signals provided to the I/O pad cell 52, including a low voltage inhibit bar signal (LVI_B) generated by a LVI generator 51 in response to a power-on reset signal (POR_B) and one or more control signals provided by SPDs. To enable normal I/O operations, the I/O pad cell 52 includes a regular receiver 54 and regular transmitter 55 connected to a shared I/O pad 57. The depicted regular receiver 54 includes an AND gate 54B that is connected to receive the input buffer enable signal (IBE) and the low voltage inhibit bar signal (LVI_B), and that is configured to output a receiver gating control signal for input to the AND gate 54A. In this arrangement, the AND gate 54A functions as an operational mode receiver which is connected to receive input data from the I/O pad 57 at a high voltage level (e.g., 1.8V) and to generate the input data "NORMAL" IND that is supplied to the core logic at a very low core Vdd level (e.g., 0.8 V). In similar fashion, the depicted regular transmitter 55 includes an AND gate 55A that is connected to receive the output buffer enable signal (OBE) and the low voltage inhibit bar signal (LVI_B), and to output a transmitter gating control signal for enabling the driver 55B which is connected to receive output data DO from the core logic at a very low core Vdd level (e.g., 0.8 V) and to generate transmit output data to the I/O pad 57 at a high voltage level (e.g., 1.8V).

To enable a VLV defect screen testing operation, the I/O pad cell 52 includes a VLV mode receiver 53 and VLV transmitter 56 which are connected through a transmit output stage of the operational mode transmitter 55 to a shared pad 57. As depicted, the VLV receiver 53 includes an AND gate 53A that is connected to receive the input buffer enable signal (IBE) and the VLV test enable signal (VLV_EN), and that is configured to output a receiver gating control signal for input to the AND gate 53B. In this arrangement, the AND gate 53B functions as very low voltage receiver which is connected to receive input data from the I/O pad 57 at an intermediate voltage level (e.g., 1.2V), and to generate the very low voltage input data VLV_IND that is supplied to the core logic at a very low core Vdd level (e.g., 0.3 V). In similar fashion, the depicted VLV transmitter 56 includes an AND gate 56A that is connected to receive the output buffer enable signal (OBE) and the VLV test enable signal (VLV_EN), and to output a transmitter gating control signal for enabling the driver 56B which is connected to receive output data DO from the core logic at a very low core Vdd level (e.g., 0.3 V) and to generate transmit output data to the I/O pad 57 at an intermediate voltage level (e.g., less than or equal to 1.2V).

Figure 6:
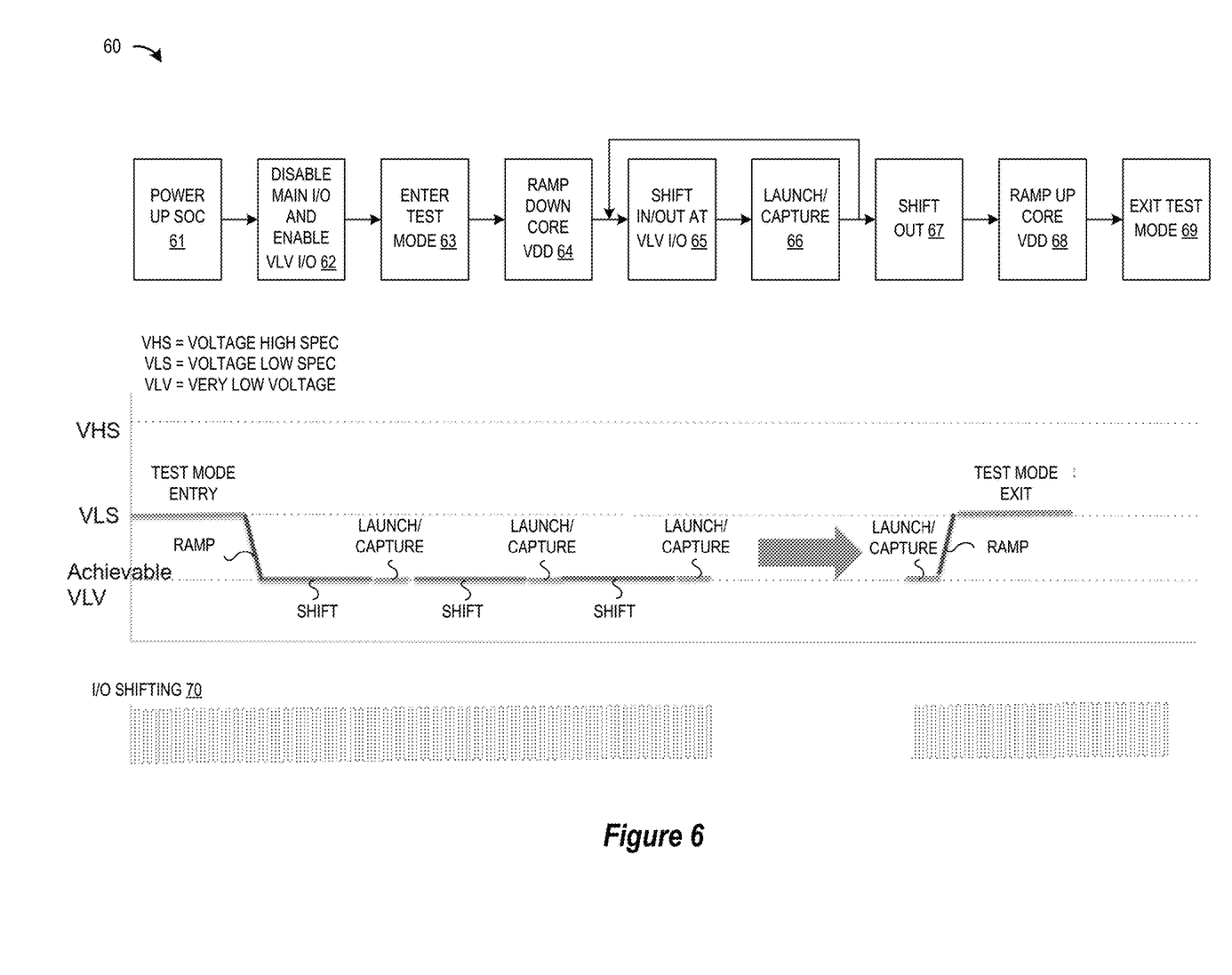
FIG. 6 illustrates a simplified timing diagram and flow chart showing the sequence of steps for implementing very low voltage testing for defect screening in accordance with selected embodiments of the present disclosure.

For an improved understanding of selected embodiments of the present disclosure, reference is now made to FIG. 6 which illustrates is a simplified timing diagram 60 and flow chart showing the sequence of steps 61-69 for implementing very low voltage testing for defect screening using a general-purpose input/output (GPIO) circuit that includes a main I/O portion and a VLV I/O test portion. As depicted, the VLV testing is implemented with a sequence that safe-states the main I/O portion while enabling the VLV portion. In particular, the VLV mode is entered by first powering up the SoC to operational voltage levels (step 61), at which point the core Vdd reaches a nominal voltage (e.g., VLS). At step 62, the main I/O portion is disabled, such as by applying the gate control signals to the output transmitter block and input receiver block. In step 62, the VLV I/O portion is also enabled, such as by applying the gate control signals to the VLV transmitter and receiver blocks. At step 63, the test sequence enters the test mode, and then the core Vdd logic voltage supply is lowered or ramped down to the available VLV at step 64. With the VLV I/O circuit operating at the lowest achievable VLV level, the scan mode is enabled and the I/O data shifting 70 is sequentially shifted into or out of the VLV I/O (at step 65) and then launched (TX) or captured (RX) at step 66 by the VLV I/O portion. As needed, the shift step 65 and launch/capture step 66 are repeated. Upon completion, the final data is shifted out (step 67) before exiting the VLV test mode by raising or ramping up the core logic Vdd voltage supply (step 68) and exiting the test mode (step 69).

From a circuit perspective, a GPIO circuit which integrates a VLV I/O circuit helps reduce the cost and complexity of the normal or operational output transmitter since normal TX level shifter would otherwise have to be overdesigned. In particular, a normal TX level shifter design could only support a core Vdd active range down to 0.35V by significantly increasing the area of the normal level shifter since DGO FETs are required for normal operation whose Vth>~0.4V. Alternatively, a normal TX level shifter design that supports very low voltage core Vdd values would typically require a significant increase in the peak current increase, since designing for 100 MHz at 0.35V tends to result in large devices whose currents at nominal voltage are then excessively high—leading to EM/IR and di/dt issues which in turn cause area growth in wires or additional on-die decap to suppress the high voltage droops. From the perspective of the SoC, the ability of the VLV I/O circuit to lower the voltage results in more fidelity in assessing real defects that could become field returns, thereby helping achieve defect rates at the 0 ppb levels of quality. From an implementation perspective, the flexibility to include VLV transmitter and VLV receivers as separate modules provides customization of area and needs for different IO applications.

Figure 7:
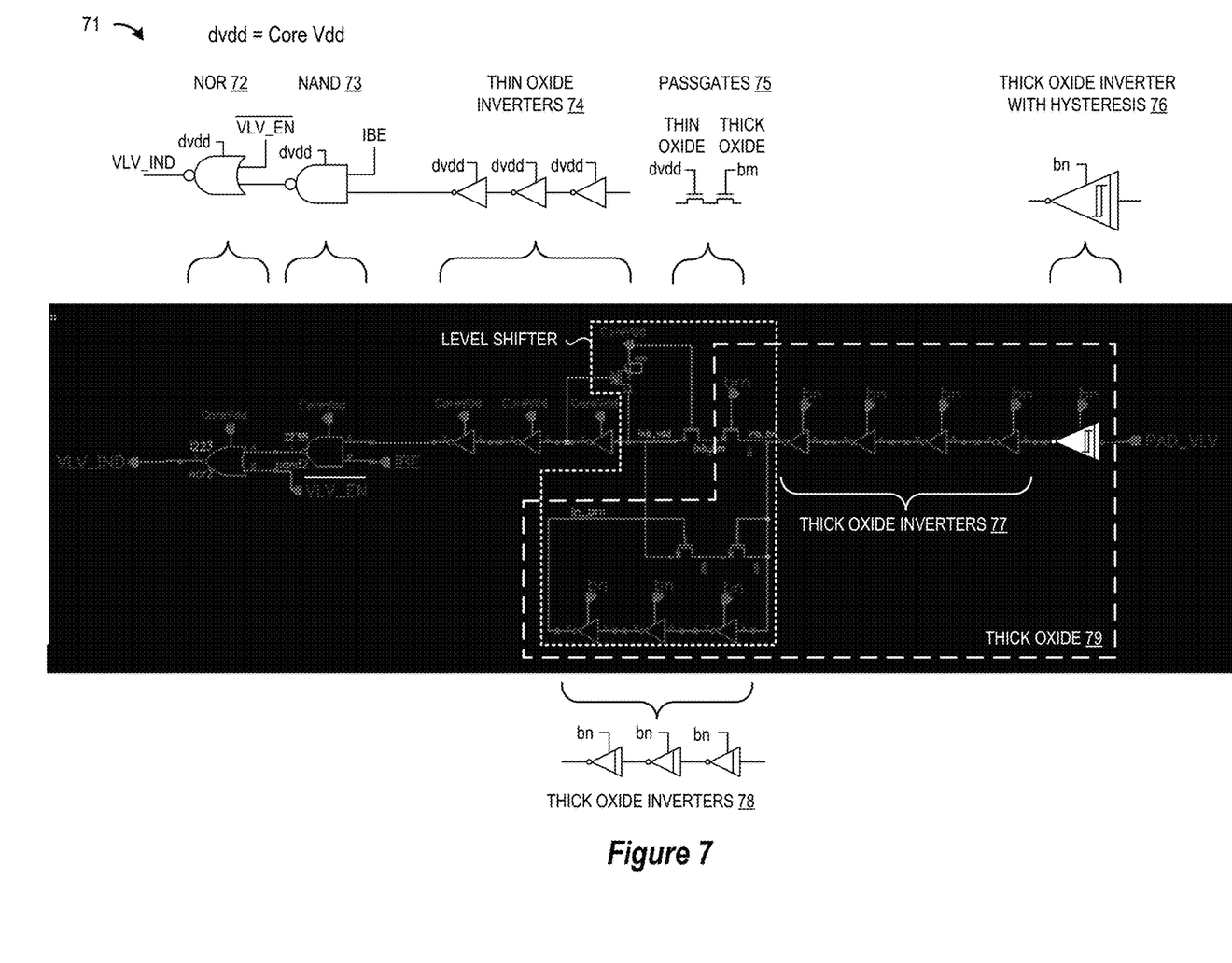
FIG. 7 illustrates a simplified circuit schematic of a VLV receiver in accordance with selected embodiments of the present disclosure.

For an improved understanding of selected embodiments of the present disclosure, reference is now made to FIG. 7 which illustrates a simplified circuit schematic of a VLV receiver 71. As depicted, the VLV receiver 71 is connected to receive the input signal PAD_VLV. As the input signal proceeds across the VLV receiver 71, the supply voltage levels proceed from bn to bm to Core Vdd, as shown. In particular, a first thick oxide inverter with hysteresis 76 with a first supply voltage bn connects the input signal PAD_VLV to the thick oxide inverters 77 which are also supplied by the first supply voltage bn. Next, the output of the thick oxide inverters 77 is connected across pass gates 75, including a first thick oxide pass gate (which is gated by the second supply voltage bm) and a second thin oxide pass gate (which is gated by the third supply voltage Core Vdd). The output from the pass gates 75 is connected to the thin oxide inverters 74 which are also supplied by the third supply voltage Core Vdd. Finally, the output from the thin oxide inverters 74 is combined with the gating control signals IBE, VLV_EN BAR using the logic gates 72, 73 as indicated to generate the VLV input test data VLV_IND. As indicated, the VLV receiver 71 includes a thick oxide transistor region 79, and the remaining transistors are formed with thin oxide transistors. In addition, the dashed box labelled "LEVEL SHIFTER" indicates that both thin oxide and thick oxide transistors are used to provide the VLV level shifter functions for the VLV receiver 71.

Figure 8:
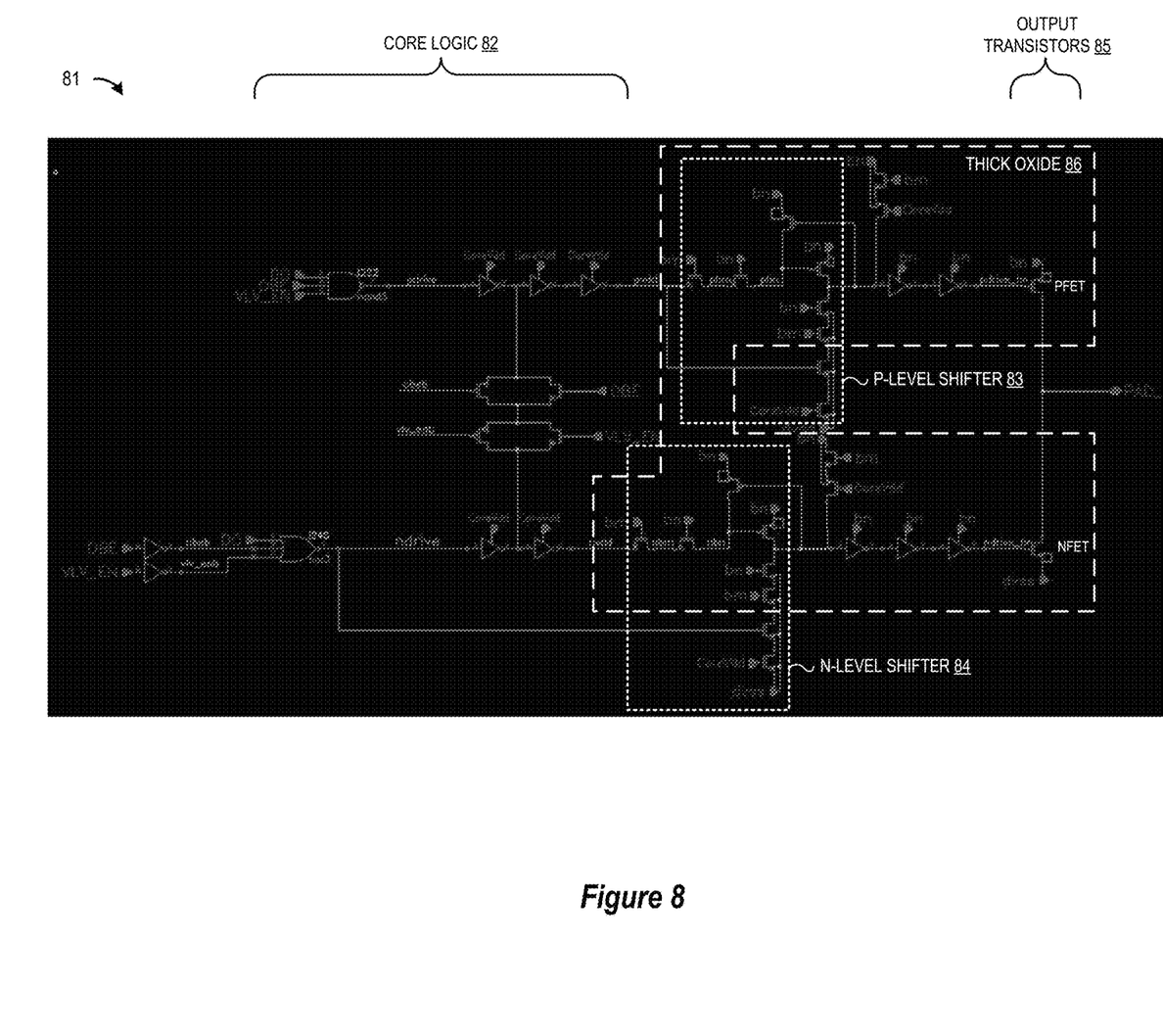
FIG. 8 illustrates a simplified circuit schematic of a VLV receiver in accordance with selected embodiments of the present disclosure.

For an improved understanding of selected embodiments of the present disclosure, reference is now made to FIG. 8 which illustrates a simplified circuit schematic of a VLV transmitter 81. As depicted, the VLV transmitter 81 is connected to receive the output data (DO) from core logic for transmission to the VLV pad PAD_VLV. As the output data (DO) proceeds across the VLV transmitter 81, the supply voltage levels proceed from Core Vdd to bm to bn, as shown. In particular, the core logic 82 includes circuit elements 82 which are supplied by a first supply voltage Core Vdd. In turn, the output from the core logic 82 is provided to the p-level shifter 83 and n-level shifter 84, each of which includes a pair of pass gates, including a first thick oxide pass gate (which is gated by the second supply voltage bm) and a second thin oxide pass gate (which is gated by the third supply voltage bn) which effectively step down the signal level for a corresponding output stage of each level shifter 83, 84. The outputs from the level shifters 83, 84 are respectively process and supplied to the output PFET and NFET transistors 85 which are connected at a shared node to drive the transmitter output VLV PAD. As indicated, the VLV transmitter 81 includes a thick oxide transistor region 86, and the remaining transistors are formed with thin oxide transistors. In addition, the dashed boxes labelled "P-LEVEL SHIFTER" and "N-LEVEL SHIFTER" indicate that both thin oxide and thick oxide transistors are used to provide the VLV level shifter functions for the VLV transmitter 81.

By now, it should be appreciated that there has been provided a general-purpose input/output (GPIO) apparatus, circuit, and methodology for a system on chip (SoC) for use with screening out manufacturing defects. As disclosed, the GPIO apparatus includes a first transmitter adapted in response to one or more first gating control signals to supply transmit data to an input/output (I/O) pad in response to output data generated by a low voltage core logic operating within a functional specification voltage range for data transmit operations, the first transmitter comprising an output stage connected to the I/O pad. In selected embodiments, the output stage of the first transmitter includes a cascoded output stage of at least first and second NFET transistors connected between the I/O pad and ground, where a drain terminal of the first NFET transistor is connected over one or more resistors to the I/O pad, and where a source terminal of the first NFET transistor is connected in common to a drain terminal of the second NFET transistor, an output of the first very low voltage transmitter, and an input of the very low voltage receiver. In addition, the GPIO apparatus includes a first receiver adapted in response to one or more second gating control signals to supply receive data to the low voltage core logic operating within the functional specification voltage range in response to input data received at the I/O pad for data receive operations. The GPIO apparatus also includes a first very low voltage transmitter adapted in response to one or more third gating control signals to supply low voltage transmit data to the output stage of the first transmitter and not directly to the I/O pad in response to output test data generated by the low voltage core logic operating with a very low core supply voltage. In selected embodiments, the first very low voltage transmitter includes a core logic block connected to receive output test data and the third gating control signals from the low voltage core logic and adapted to generate a core logic block output signal; a level shifter connected to an output of the core logic block and configured to generate one or more level shifted signals at an intermediate voltage level by applying an up-level shift to shift the core logic block output signal from the very low core supply voltage to the intermediate voltage level; and an output driver stage connected to receive the one or more level shifted signals and configured to supply the very low voltage transmit data to the output stage of the first transmitter. Finally, the GPIO apparatus also includes a first very low voltage receiver adapted in response to one or more fourth gating control signals to supply very low voltage receive data to the low voltage core logic operating with the very low core supply voltage in response to input data received from the output stage of the first transmitter and not directly from the I/O pad. In selected embodiments, the first very low voltage receiver includes a plurality of inverters connected to receive input data and adapted to generate an output signal at an intermediate voltage level; a level shifter connected to an output of the plurality of inverters and configured to generate one or more level shifted signals at an intermediate voltage level by applying a down-level shift to shift the output signal from the intermediate voltage level to the very low core supply voltage; and one or more logic gates connected to receive the one or more level shifted signals and the one or more fourth gating control signals, and configured to output the very low voltage receive data to the low voltage core logic operating with very low core supply voltage. In selected embodiments, the very low core supply voltage is close to the threshold voltage of the field effect transistors forming the low voltage core logic. In other embodiments, the functional specification voltage range is at least approximately 0.8 volts, and the very low core supply voltage is approximately 0.3 volts. In selected operational embodiments, the first, second, and third gating control signals may be configured to disable the first transmitter, first receiver, and first very low voltage transmitter from operating, and the one or more fourth gating control signals may be configured to enable the first very low voltage receiver to be used to apply a very low voltage defect screening test to the low voltage core logic in the SoC. In other operational embodiments, the first, second, and fourth gating control signals may be configured to disable the first transmitter, first receiver, and first very low voltage receiver from operating, and where the one or more third gating control signals may be configured to enable the first very low voltage transmitter to be used to apply a very low voltage defect screening test to the low voltage core logic in the SoC.

In another form, there is provided a method, apparatus, and circuit for use with screening out manufacturing defects. As disclosed, the method includes powering up a system on chip (SoC) which includes a general-purpose input/output (GPIO) circuit connected between a low voltage core logic and an input/output (I/O) pad. The disclosed method also includes entering a defect screening test mode by disabling a main I/O section of the GPIO circuit and enabling a very low voltage (VLV) I/O section of the GPIO circuit. In addition, the disclosed method includes ramping down a core logic Vdd voltage supply for the low voltage core logic to a low Core-Vdd voltage level that is close to a threshold voltage Vth for core transistors used to form the low voltage core logic. The disclosed method also includes transferring test data between the low voltage core logic and the I/O pad using the VLV I/O section which is configured to operate in a VLV test mode. In selected embodiments, the test data is transferred between the low voltage core logic and the I/O pad by using a VLV transmitter section of the VLV I/O section which is configured to operate in a VLV test mode to provide transmit test data to a transmitter output stage of the main I/O second and not directly to the I/O pad. In other embodiments, the test data is transferred between the low voltage core logic and the I/O pad by using a VLV receiver section of the VLV I/O section which is configured to operate in a VLV test mode to receive test data from a transmitter output stage of the main I/O second and not directly from the I/O pad. In addition, the disclosed method includes ramping up the core logic Vdd voltage supply for the low voltage core logic to an operational Core-Vdd voltage level for the low voltage core logic. Finally, the disclosed method includes exiting the defect screening test mode by enabling the main I/O section of the GPIO circuit and disabling the VLV I/O section of the GPIO circuit. In selected embodiments, the main I/O section of the GPIO circuit is optimized for a functional operation in a specified operating voltage range, and where the VLV I/O section of the GPIO circuit is optimized for a VLV test mode operation at the low Core-Vdd voltage level.

In yet another form, there is provided an integrated circuit, method, and system for screening out manufacturing defects. As disclosed, the integrated circuit includes a digital core configured to output a first voltage signal, an input/output (I/O) pad, and an I/O pad cell connecting the digital core to the I/O pad. As disclosed, the I/O pad cell is configured to operate in a functional mode in response to one or more first control signals to convert the first voltage signal into an operational data signal within a functional specification voltage range for data transmit and receive operations and provides the operational data signal to circuitry external to the integrated circuit. In addition, the I/O pad cell is configured to operate in a very low voltage test mode in response to one or more second control signals to convert the first voltage signal into a test data signal within a VLV Core-Vdd voltage range that is close to a threshold voltage Vth for core transistors used to form the digital core. In selected embodiments, the I/O pad cell includes a first transmitter, a first receiver, a first VLV transmitter, and a first VLV receiver. The first transmitter is adapted in response to one or more first gating control signals to supply transmit data to the I/O pad in response to the first voltage signal generated by the digital core operating within the functional specification voltage range for data transmit operations. In addition, the first receiver is adapted in response to one or more second gating control signals to supply receive data to the digital core operating within the functional specification voltage range in response to input data received at the I/O pad for data receive operations. In addition, the first VLV transmitter is adapted in response to one or more third gating control signals to supply low voltage transmit data to the I/O pad in response to the first voltage signal generated by the digital core operating with a very low core supply voltage. In addition, the first VLV receiver is adapted in response to one or more fourth gating control signals to supply very low voltage receive data to the digital core operating with the very low core supply voltage in response to input data received from the I/O pad. In selected embodiments, the first VLV receiver may include a first logical AND gate that is connected to receive a very low voltage enable gating control signal and an input buffer enable gating control signal and that is configured to output a VLV receiver gating control signal, and may also include a second logical AND gate that is connected to receive the VLV receiver gating control signal and input test data signal from the I/O pad, and that is configured to output a very low voltage input data signal to the digital core. In addition, the first receiver may include a first logical AND gate that is connected to receive a high voltage enable gating control signal and an input buffer enable gating control signal and that is configured to output a receiver gating control signal, and may also include a second logical AND gate that is connected to receive the receiver gating control signal and input data signal from the I/O pad and that is configured to output the receive data to the digital core. In addition, the first transmitter may include a first logical AND gate that is connected to receive a high voltage enable gating control signal and an output buffer enable gating control signal and that is configured to output a transmitter gating control signal, and may also include an output driver that is connected to supply the transmit data to the I/O pad under control of the transmitter gating control signal. In addition, the first very low voltage transmitter may include a first logical AND gate that is connected to receive a very low voltage enable gating control signal and an output buffer enable gating control signal and that is configured to output a VLV transmitter gating control signal, and may also include an output driver that is connected to supply the low voltage transmit data to the I/O pad under control of the VLV transmitter gating control signal. In selected embodiments, the I/O pad cell may include a main I/O section and a very low voltage (VLV) I/O section, where the main I/O section may be configured in a safe state while the VLV I/O section is operative to perform a defect screening test of the integrated circuit. In such embodiments, the main I/O section may include a first transmitter adapted in response to one or more first gating control signals to supply transmit data to the I/O pad in response to the first voltage signal generated by the digital core, where the first transmitter comprising an output stage connected to the I/O pad. In addition, the VLV I/O section may include a first very low voltage transmitter adapted in response to one or more second gating control signals to supply low voltage transmit data to the output stage of the first transmitter and not directly to the I/O pad in response to output test data generated by the digital core logic operating with a very low core supply voltage.

Although the described exemplary embodiments disclosed herein are directed to various GPIO methods and circuits for integrating very low voltage transmitter and receiver circuits which are sourced through an NMOS stacked gate in the operational transmitter, the present invention is not necessarily limited to the example embodiments which illustrate inventive aspects of the present invention that are applicable to a wide variety of circuits, processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A general-purpose input/output (GPIO) apparatus of a system on chip (SoC) comprising:
   a first transmitter adapted in response to one or more first gating control signals to supply transmit data to an input/output (I/O) pad in response to output data generated by a low voltage core logic operating within a functional specification voltage range for data transmit operations, the first transmitter comprising an output stage connected to the I/O pad;
   a first receiver adapted in response to one or more second gating control signals to supply receive data to the low voltage core logic operating within the functional specification voltage range in response to input data received at the I/O pad for data receive operations;
   a first very low voltage transmitter adapted in response to one or more third gating control signals to supply low voltage transmit data to the output stage of the first transmitter and not directly to the I/O pad in response to output test data generated by the low voltage core logic operating with a very low core supply voltage; and
   a first very low voltage receiver adapted in response to one or more fourth gating control signals to supply very low voltage receive data to the low voltage core logic operating with the very low core supply voltage in response to input data received from the output stage of the first transmitter and not directly from the I/O pad.

2. The GPIO apparatus of claim 1, where the output stage of the first transmitter comprises a cascoded output stage of at least first and second NFET transistors connected between the I/O pad and ground, where a drain terminal of the first NFET transistor is connected over one or more resistors to the I/O pad, and where a source terminal of the first NFET transistor is connected in common to a drain terminal of the second NFET transistor, an output of the first very low voltage transmitter, and an input of the very low voltage receiver.

3. The GPIO apparatus of claim 1, where the very low core supply voltage is close to the threshold voltage of the field effect transistors forming the low voltage core logic.

4. The GPIO apparatus of claim 1, where the functional specification voltage range is at least approximately 0.8 volts, and where the very low core supply voltage is approximately 0.3 volts.

5. The GPIO apparatus of claim 1, where the first very low voltage transmitter comprises:
   a core logic block connected to receive output test data and the third gating control signals from the low voltage core logic and adapted to generate a core logic block output signal;
   a level shifter connected to an output of the core logic block and configured to generate one or more level shifted signals at an intermediate voltage level by applying an up-level shift to shift the core logic block output signal from the very low core supply voltage to the intermediate voltage level; and
   an output driver stage connected to receive the one or more level shifted signals and configured to supply the very low voltage transmit data to the output stage of the first transmitter.

6. The GPIO apparatus of claim 1, where the first very low voltage receiver comprises:
   a plurality of inverters connected to receive input data and adapted to generate an output signal at an intermediate voltage level;
   a level shifter connected to an output of the plurality of inverters and configured to generate one or more level shifted signals at an intermediate voltage level by applying a down-level shift to shift the output signal from the intermediate voltage level to the very low core supply voltage; and
   one or more logic gates connected to receive the one or more level shifted signals and the one or more fourth gating control signals, and configured to output the very low voltage receive data to the low voltage core logic operating with the very low core supply voltage.

7. The GPIO apparatus of claim 1, where first, second, and third gating control signals are configured to disable the first transmitter, first receiver, and first very low voltage transmitter from operating, and where the one or more fourth gating control signals are configured to enable the first very low voltage receiver to be used to apply a very low voltage defect screening test to the low voltage core logic in the SoC.

8. The GPIO apparatus of claim 1, where first, second, and fourth gating control signals are configured to disable the first transmitter, first receiver, and first very low voltage receiver from operating, and where the one or more third gating control signals are configured to enable the first very low voltage transmitter to be used to apply a very low voltage defect screening test to the low voltage core logic in the SoC.

9. An integrated circuit comprising:
- a digital core which includes the low voltage core logic and is configured to output a first voltage signal;
- the input/output (I/O) pad; and
- an I/O pad cell connecting the digital core to the I/O pad, the I/O pad cell comprising the GPIO apparatus of claim 1;
- wherein the I/O pad cell is configured to operate in a functional mode in response to one or more first control signals to convert the first voltage signal into an operational data signal within a functional specification voltage range for data transmit and receive operations and provides the operational data signal to circuitry external to the integrated circuit; and
- wherein the I/O pad cell is configured to operate in a very low voltage test mode in response to one or more second control signals to convert the first voltage signal into a test data signal within a VLV Core-Vdd voltage range that is close to a threshold voltage Vth for core transistors used to form the digital core.

10. The integrated circuit of claim 9, where the I/O pad cell comprises a main I/O section and a very low voltage (VLV) I/O section, where the main I/O section may be configured in a safe state while the VLV I/O section is operative to perform a defect screening test of the integrated circuit.

11. The integrated circuit of claim 10,
- where the main I/O section comprises the first transmitter; and
- where the VLV I/O section comprises the first very low voltage transmitter.

\* \* \* \* \*